US011121025B2

(12) United States Patent
Hsu et al.

(10) Patent No.: US 11,121,025 B2
(45) Date of Patent: Sep. 14, 2021

(54) LAYER FOR SIDE WALL PASSIVATION

(71) Applicant: Taiwan Semiconductor Manufacturing Company, Ltd., Hsinchu (TW)

(72) Inventors: Yun-Chang Hsu, Hsinchu (TW); Sheng-Liang Pan, Hsinchu (TW); Huan-Just Lin, Hsinchu (TW); Jack Kuo-Ping Kuo, Pleasanton, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 64 days.

(21) Appl. No.: 16/568,622

(22) Filed: Sep. 12, 2019

(65) Prior Publication Data

US 2020/0105586 A1 Apr. 2, 2020

Related U.S. Application Data

(60) Provisional application No. 62/737,664, filed on Sep. 27, 2018.

(51) Int. Cl.
*H01L 21/768* (2006.01)
*H01L 23/522* (2006.01)
(Continued)

(52) U.S. Cl.
CPC .. *H01L 21/76814* (2013.01); *H01L 21/76802* (2013.01); *H01L 21/76877* (2013.01);
(Continued)

(58) Field of Classification Search
CPC ......... H01L 21/76814; H01L 21/76877; H01L 21/76807–76813;
(Continued)

(56) References Cited

U.S. PATENT DOCUMENTS 5,470,790 A 11/1995 Myers et al.
6,194,309 B1* 2/2001 Jin ................... H01L 21/02063
257/E21.252
(Continued)

FOREIGN PATENT DOCUMENTS

TW 411559 B 11/2000
TW I559447 B 11/2016
(Continued)

OTHER PUBLICATIONS

Lee, J.S. et al., "Growth and Characterization of a and β-phase Tungsten Films on Various Substrates," Journal of Vacuum Science & Technology A34, available online at https://doi.org/10.1116/1A936261, Published by the American Vacuum Society, 2015, 6 pages.

*Primary Examiner* — Jarrett J Stark
(74) *Attorney, Agent, or Firm* — Slater Matsil, LLP

(57) ABSTRACT

A method of manufacturing a semiconductor device includes etching a via through a dielectric layer and an etch stop layer (ESL) to a source/drain contact, forming a recess in the top surface of the source/drain contact such that the top surface of the source/drain contact is concave, and forming an oxide liner on the sidewalls of the via. The oxide liner traps impurities left behind by the etching of the via through the dielectric layer and the ESL, wherein the etching, the forming the recess, and the forming the oxide liner are performed in a first chamber. The method further includes performing a pre-cleaning that removes the oxide liner and depositing a metal in the via.

20 Claims, 16 Drawing Sheets

(51) Int. Cl.
*H01L 29/417* (2006.01)
*H01L 23/532* (2006.01)

(52) U.S. Cl.
CPC .... *H01L 23/5226* (2013.01); *H01L 23/53257* (2013.01); *H01L 29/41725* (2013.01)

(58) Field of Classification Search
CPC .......................... H01L 2221/1015–1036; H01L 21/76801–76837
See application file for complete search history.

(56) References Cited

U.S. PATENT DOCUMENTS

| | | | |
|---|---|---|---|
| 6,222,272 | B1 | 4/2001 | Takayama et al. |
| 6,224,737 | B1 | 5/2001 | Tsai et al. |
| 6,548,905 | B2 | 4/2003 | Park et al. |
| 7,423,347 | B2 | 9/2008 | Chen et al. |
| 7,517,736 | B2 | 4/2009 | Mehta et al. |
| 8,008,190 | B2 * | 8/2011 | Yamada ............ H01L 21/76831 438/637 |
| 8,277,619 | B2 | 10/2012 | Chang et al. |
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,640,509 | B1 | 5/2017 | Yang |
| 9,831,183 | B2 | 11/2017 | Lin et al. |
| 9,859,386 | B2 | 1/2018 | Ho et al. |
| 9,935,051 | B2 | 4/2018 | Adusumilli et al. |
| 10,163,786 | B2 | 12/2018 | Yang |
| 10,170,427 | B2 | 1/2019 | Chang et al. |
| 10,446,449 | B2 * | 10/2019 | Hsu ................... H01L 21/76831 |
| 10,847,413 | B2 * | 11/2020 | Khaderbad ....... H01L 21/76849 |
| 10,861,706 | B2 * | 12/2020 | Ouyang ................ H01L 21/268 |
| 2002/0090796 | A1 | 7/2002 | Desai et al. |
| 2003/0160331 | A1 * | 8/2003 | Fujisawa ........... H01L 21/76868 257/774 |
| 2005/0275110 | A1 * | 12/2005 | Maekawa ......... H01L 21/76814 257/760 |
| 2006/0128163 | A1 * | 6/2006 | Chen ................. H01L 21/76831 438/780 |
| 2013/0052809 | A1 * | 2/2013 | Tung ................. H01L 21/02532 438/503 |
| 2015/0380302 | A1 * | 12/2015 | Mountsier ......... H01L 21/02219 438/654 |
| 2016/0030766 | A1 | 2/2016 | Scritchfield et al. |
| 2016/0079161 | A1 * | 3/2016 | Lin ................... H01L 21/32134 257/774 |
| 2016/0111371 | A1 * | 4/2016 | Peng ................. H01L 21/76805 257/751 |
| 2017/0092590 | A1 * | 3/2017 | Spooner ............ H01L 21/76814 |
| 2020/0006140 | A1 * | 1/2020 | Tapily ............... H01L 21/76897 |
| 2020/0043777 | A1 * | 2/2020 | Kung ................ H01L 21/76826 |
| 2020/0105586 | A1 * | 4/2020 | Hsu .................. H01L 21/76805 |

FOREIGN PATENT DOCUMENTS

| | | |
|---|---|---|
| TW | 201822280 A | 6/2018 |
| TW | 201824492 A | 7/2018 |

* cited by examiner

LAYER FOR SIDE WALL PASSIVATION

PRIORITY CLAIM AND CROSS-REFERENCE

This application claims the benefit of U.S. Provisional Application No. 62/737,664, filed on Sep. 27, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to increase the density of electronic components (e.g., transistors, diodes, resistors, capacitors, etc.) in integrated circuits (ICs) by innovations in semiconductor technology such as, progressive reductions in minimum feature size, three-dimensional (3D) transistor structures (e.g., the fin field-effect transistor (FinFET)), increasing the number of interconnect levels, and non-semiconductor memory, such as ferroelectric random access memory (RAM) or FRAM, and magneto-resistive RAM or MRAM, within the interconnect levels stacked above the semiconductor substrate. However, as the minimum features sizes are reduced, additional problems arise that should be addressed.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

FIGS. 2 through 12A and 13 are views of respective intermediate structures at respective stages during an example method for forming conductive features in accordance with some embodiments.

DETAILED DESCRIPTION

Figure 1:
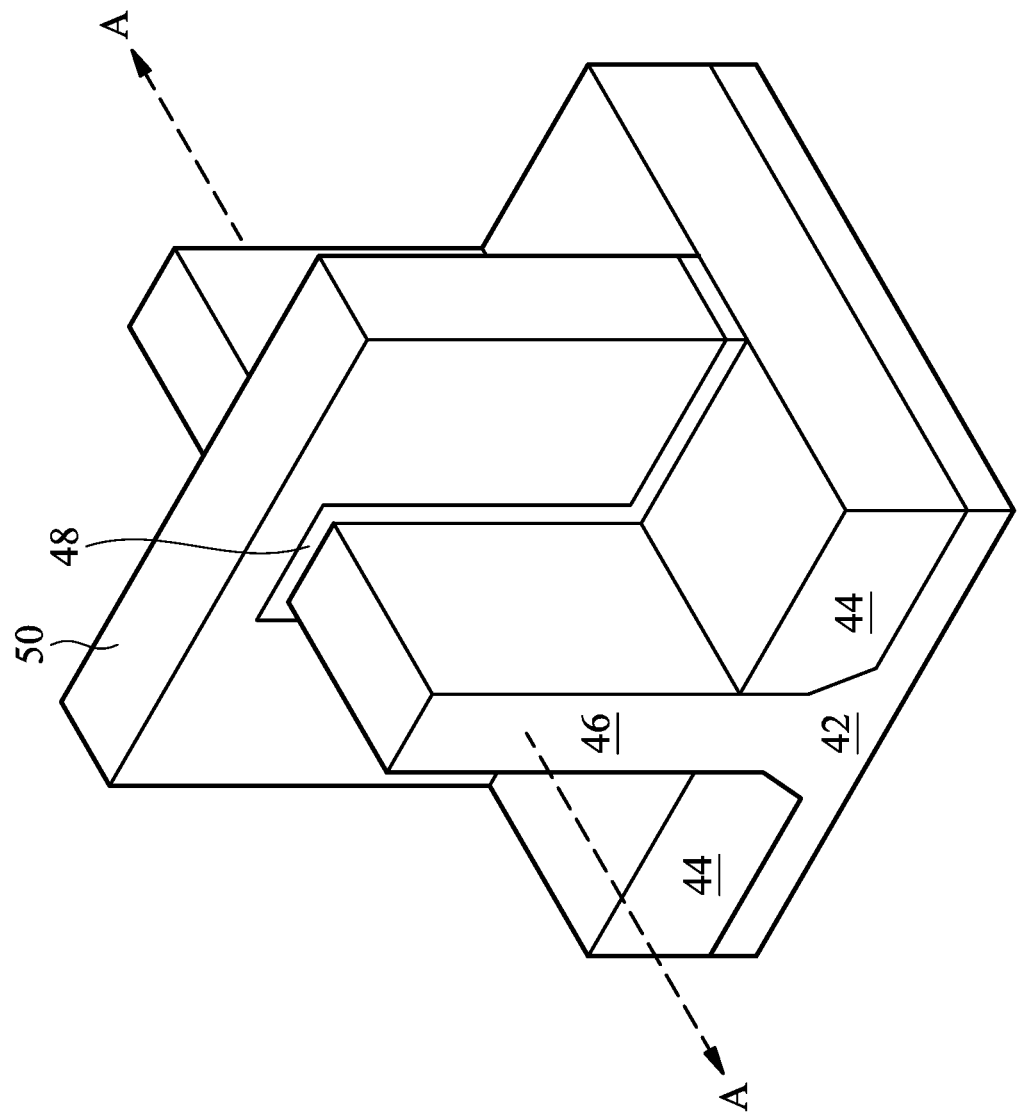
FIG. 1 illustrates an embodiment of a FinFET in a three-dimensional view, in accordance with some embodiments.

The following disclosure provides many different embodiments, or examples, for implementing different features of the invention. Specific embodiments of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. Advantageous features of one or more embodiments disclosed herein include a process for a reduction of resistance in vias by way of an oxide liner. By removing impurities from an earlier etch process, contact resistance in the via-to-interconnect (V0) layer can be reduced. Improved device performance can result. Other advantageous features may include reducing outgassing from an exposed middle contact etch stop layer (MCESL).

Example embodiments described herein are described in the context of forming conductive features in Back End Of the Line (BEOL) and/or Middle End Of the Line (MEOL) processing for a Fin Field Effect Transistor (FinFET). Other embodiments may be implemented in other contexts, such as with different devices, such as planar Field Effect Transistors (FETs), Vertical Gate All Around (VGAA) FETs, Horizontal Gate All Around (HGAA) FETs, bipolar junction transistors (BJTs), diodes, capacitors, inductors, resistors, etc. In some instances, the conductive feature may be part of the device, such as a plate of a capacitor or a line of an inductor. Further, some embodiments may be implemented in Front End Of the Line (FEOL) processing and/or for forming any conductive feature. Implementations of some aspects of the present disclosure may be used in other processes and/or in other devices.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some Figures, some reference numbers of components or features illustrated therein may be omitted to avoid obscuring other components or features; this is for ease of depicting the Figures.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 13 illustrate views of respective intermediate structures at respective stages during an example method for forming conductive features in accordance with some embodiments. FIG. 1 illustrates a perspective view of an intermediate structure at a stage of the example method. The intermediate structure, as described in the following, is used in the implementation of FinFETs. Other structures may be implemented in other example embodiments.

The intermediate structure includes a fin 46 formed on a semiconductor substrate 42, with respective isolation regions 44 on the semiconductor substrate 42 adjacent to fin 46. A first dummy gate stack is along sidewalls of and over the fin 46. The first dummy gate stack includes an interfacial dielectric 48 and a dummy gate 50. Although not illustrated in FIG. 1, multiple fins 46 may be formed adjacent to each other, and multiple dummy gate stacks may be formed over the fins 46.

The semiconductor substrate 42 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 42 may include an elemental semiconductor such as silicon (Si) or germanium (Ge); a compound semiconductor; an alloy semiconductor; or a combination thereof.

The fins 46 are formed in the semiconductor substrate 42. The fins 46 may be patterned by any suitable method. For example, the fins 46 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor substrate 42 and patterned using a photolithography process. Spacers are formed alongside the patterned sacrificial layer using a self-aligned process. The sacrificial layer is then removed, and the remaining spacers may then be used to pattern the fins 46.

The semiconductor substrate 42 may be etched, such as by appropriate photolithography and etch processes, such that trenches are formed between neighboring pairs of fins 46 and such that the fins 46 protrude from the semiconductor substrate 42. Isolation regions 44 are formed with each being in a corresponding trench. The isolation regions 44 may include or be an insulating material such as an oxide (such as silicon oxide), a nitride, the like, or a combination thereof. The insulating material may then be recessed after being deposited to form the isolation regions 44. The insulating material is recessed using an acceptable etch process such that the fins 46 protrude from between neighboring isolation regions 44, which may, at least in part, thereby delineate the fins 46 as active areas on the semiconductor substrate 42. The fins 46 may be formed by other processes, and may include homoepitaxial and/or heteroepitaxial structures, for example.

The dummy gate stacks are formed on the fins 46. In a replacement gate process as described herein, the interfacial dielectrics 48, dummy gates 50, and masks 52 for the dummy gate stacks may be formed by sequentially forming respective layers by appropriate deposition processes, for example, and then patterning those layers into the dummy gate stacks by appropriate photolithography and etch processes. For example, the interfacial dielectrics 48 may include or be silicon oxide, silicon nitride, the like, or multilayers thereof. The dummy gates 50 may include or be silicon (e.g., polysilicon) or another material. The masks 52 may include or be silicon nitride, silicon oxynitride, silicon carbon nitride, the like, or a combination thereof.

In other embodiments, instead of and/or in addition to the dummy gate stacks, the gate stacks can be operational gate stacks (or more generally, gate structures) in a gate-first process. In a gate-first process, the interfacial dielectric 48 may be a gate dielectric layer, and the dummy gate 50 may be a gate electrode. The gate dielectric layers, gate electrodes, and masks 52 for the operational gate stacks may be formed by sequentially forming respective layers by appropriate deposition processes, and then patterning those layers into the gate stacks by appropriate photolithography and etch processes. For example, the gate dielectric layers may include or be silicon oxide, silicon nitride, a high-k dielectric material, the like, or multilayers thereof. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate electrodes may include or be silicon (e.g., polysilicon, which may be doped or undoped), a metal-containing material (such as titanium, tungsten, aluminum, ruthenium, or the like), a combination thereof (such as a silicide (which may be subsequently formed), or multiple layers thereof. The masks 52 may include or be silicon nitride, silicon oxynitride, silicon carbon nitride, the like, or a combination thereof.

Figure 2:
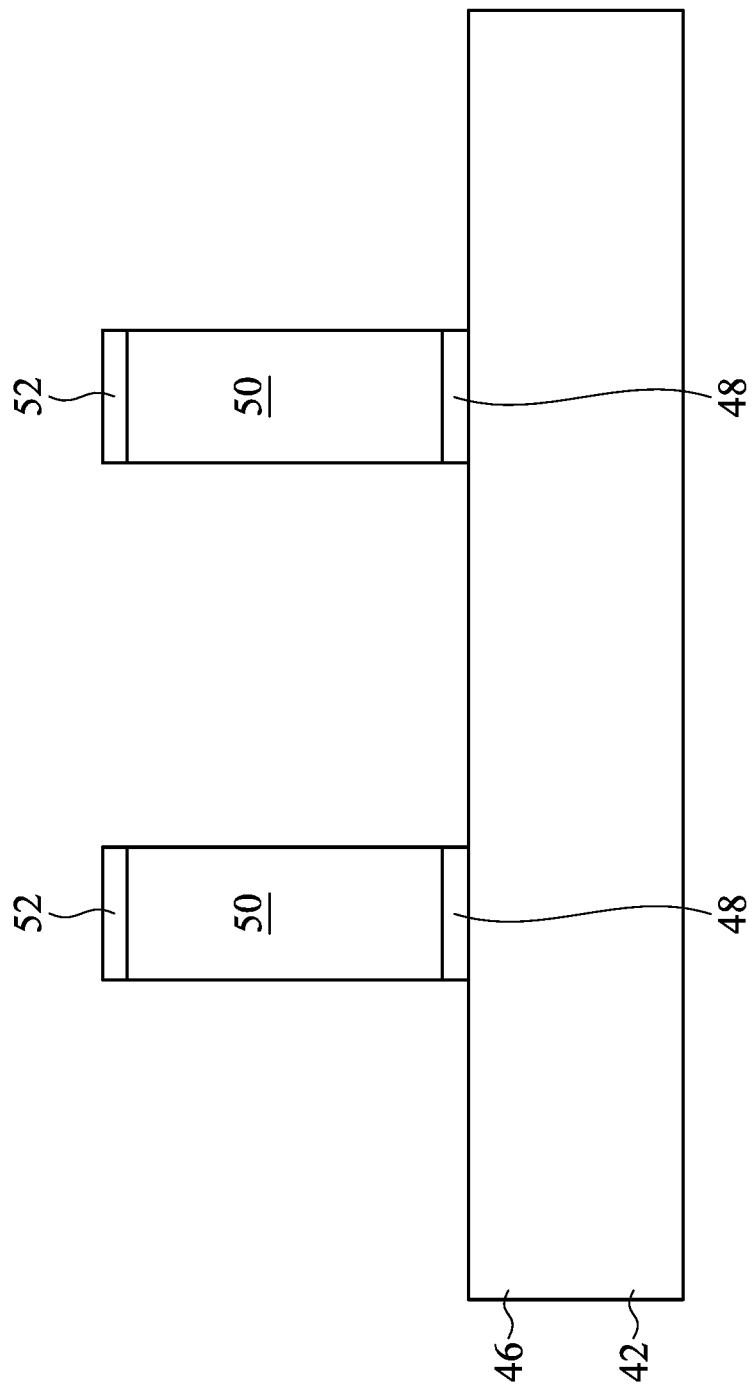

FIG. 1 further illustrates a reference cross-section that is used in later figures. Cross-section A-A is in a plane along, e.g., channels in the fin 46 between opposing source/drain regions. The FIGS. 2 through 12 illustrate cross-sectional views at various stages of processing in various example methods corresponding to cross-section A-A. FIG. 2 illustrates a cross-sectional view of the intermediate structure of FIG. 1 at the cross-section A-A. FIG. 2 illustrates adjacent gate stacks on top of the fin 46. Masks 52 are located on top of the gate stacks.

Figure 3:
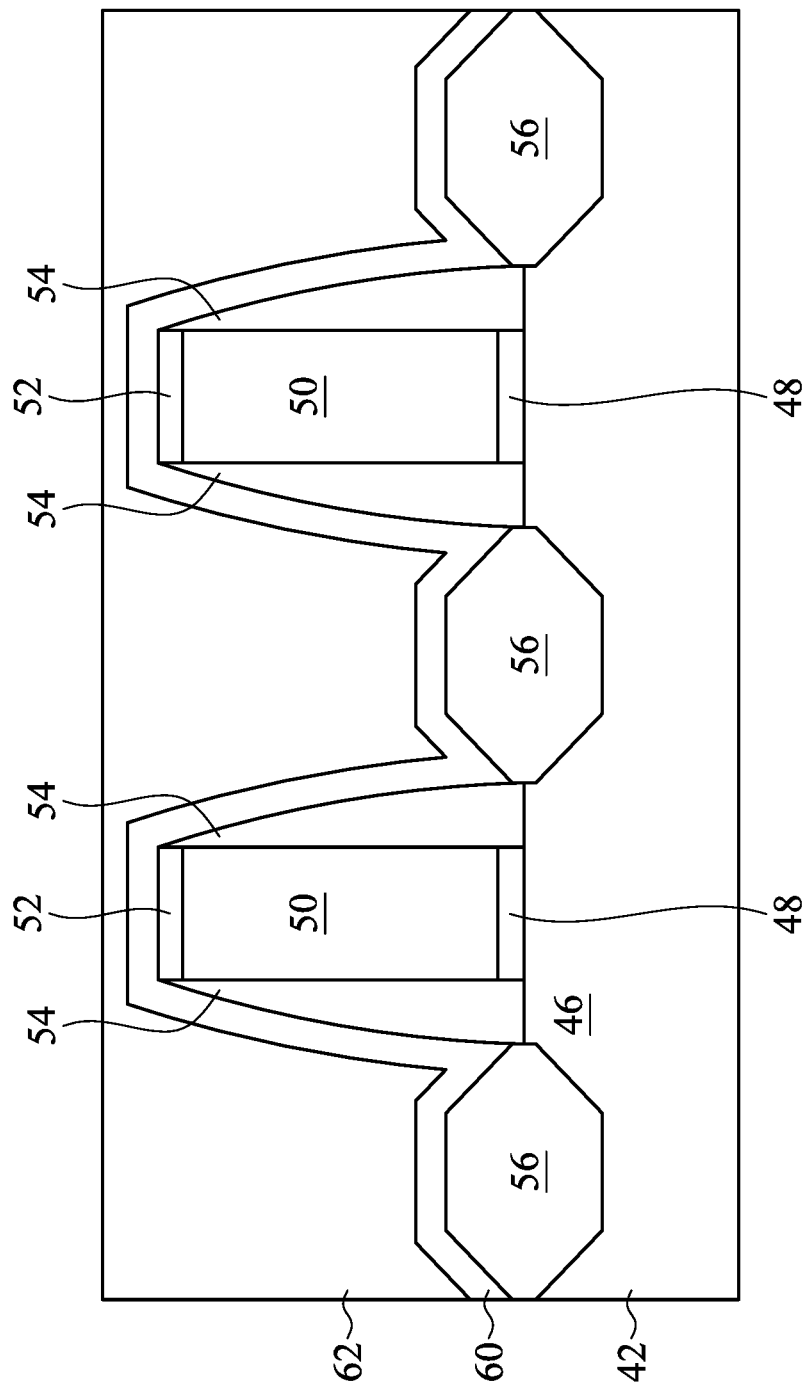

FIG. 3 illustrates the formation of gate spacers 54, epitaxy source/drain regions 56, a contact etch stop layer (CESL) 60, and a first interlayer dielectric (ILD) 62. Gate spacers 54 are formed along sidewalls of the dummy gate stacks (e.g., sidewalls of the interfacial dielectrics 48, dummy gates 50, and masks 52) and over the fins 46. The gate spacers 54 may be formed by conformally depositing, by an appropriate deposition process, one or more layers for the gate spacers 54 and anisotropically etching the one or more layers, for example. The one or more layers for the gate spacers 54 may include or be silicon oxygen carbide, silicon nitride, silicon oxynitride, silicon carbon nitride, the like, multi-layers thereof, or a combination thereof.

Recesses are then formed in the fins 46 on opposing sides of the dummy gate stacks (e.g., using the dummy gate stacks and gate spacers 54 as a mask) by an etch process. The etch process can be isotropic or anisotropic, or further, may be selective with respect to one or more crystalline planes of the semiconductor substrate 42. Hence, the recesses can have various cross-sectional profiles based on the etch process implemented. The epitaxy source/drain regions 56 are formed in the recesses. The epitaxy source/drain regions 56 may include or be silicon germanium, silicon carbide, silicon phosphorus, silicon carbon phosphorus, pure or substantially pure germanium, a III-V compound semiconductor, a II-VI compound semiconductor, or the like. The epitaxy source/drain regions 56 may be formed in the recesses by an appropriate epitaxial growth or deposition process. In some embodiments, epitaxy source/drain regions 56 can be raised with respect to the fin 46, and can have facets, which may correspond to crystalline planes of the semiconductor substrate 42.

A person having ordinary skill in the art will also readily understand that the recessing and epitaxial growth may be omitted, and that source/drain regions may be formed by implanting dopants into the fins 46 using the dummy gate stacks and gate spacers 54 as masks. In some embodiments where epitaxy source/drain regions 56 are implemented, the epitaxy source/drain regions 56 may also be doped, such as by in situ doping during epitaxial growth and/or by implanting dopants into the epitaxy source/drain regions 56 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

The CESL 60 is conformably deposited, by an appropriate deposition process, on surfaces of the epitaxy source/drain regions 56, sidewalls and top surfaces of the gate spacers 54, top surfaces of the masks 52, and top surfaces of the isolation regions 44. Generally, an etch stop layer (ESL) can provide a mechanism to stop an etch process when forming, e.g., contacts or vias. An ESL may be formed of a dielectric material having a different etch selectivity from adjacent layers or components. The CESL 60 may comprise or be silicon nitride, silicon carbon nitride, silicon carbon oxide, carbon nitride, the like, or a combination thereof.

The first ILD 62 is deposited, by an appropriate deposition process, on the CESL 60. The first ILD 62 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

The first ILD 62 may be planarized after being deposited, such as by a chemical mechanical planarization (CMP). In a gate-first process, a top surface of the first ILD 62 may be above the upper portions of the CESL 60 and the gate stacks, and processing described below with respect to FIGS. 4 and 5 may be omitted. Hence, the upper portions of the CESL 60 and first ILD 62 may remain over the gate stacks.

Figure 4:
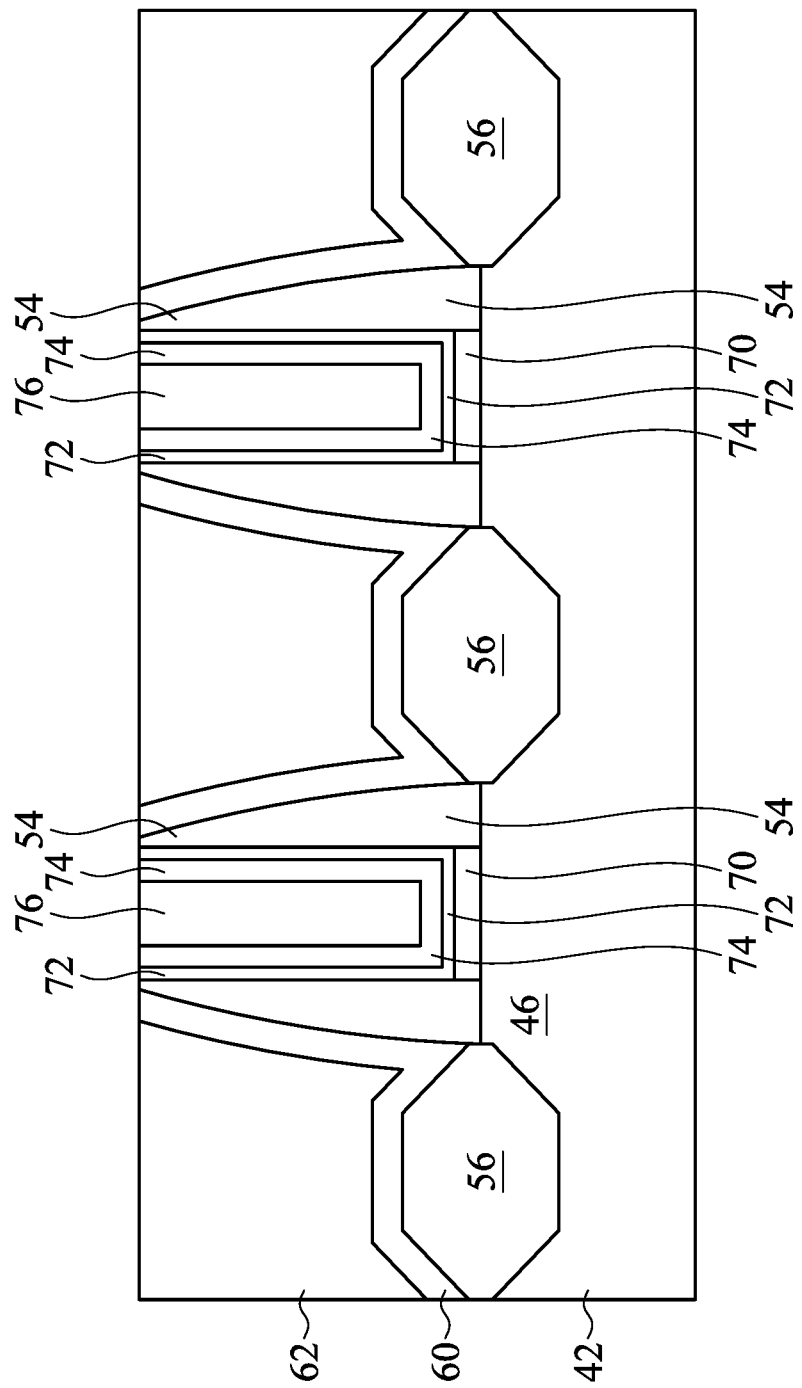

FIG. 4 illustrates the replacement of the dummy gate stacks with replacement gate structures. The first ILD 62 and CESL 60 are formed with top surfaces coplanar with top surfaces of the dummy gates 50. A planarization process, such as a CMP, may be performed to level the top surfaces of the first ILD 62 and CESL 60 with the top surfaces of the dummy gates 50. The CMP may also remove the masks 52 (and, in some instances, upper portions of the gate spacers 54) on the dummy gates 50. Accordingly, top surfaces of the dummy gates 50 are exposed through the first ILD 62 and the CESL 60.

With the dummy gates 50 exposed through the first ILD 62 and the CESL 60, the dummy gates 50 are removed, such as by one or more etch processes. The dummy gates 50 may be removed by an etch process selective to the dummy gates 50, wherein the interfacial dielectrics 48 act as ESLs, and subsequently, the interfacial dielectrics 48 can optionally be removed by a different etch process selective to the interfacial dielectrics 48. Recesses are formed between gate spacers 54 where the dummy gate stacks are removed, and channel regions of the fins 46 are exposed through the recesses.

The replacement gate structures are formed in the recesses where the dummy gate stacks were removed. The replacement gate structures each include, as illustrated, an interfacial dielectric 70, a gate dielectric layer 72, one or more optional conformal layers 74, and a gate conductive fill material 76. The interfacial dielectric 70 is formed on sidewalls and top surfaces of the fins 46 along the channel regions. The interfacial dielectric 70 can be, for example, the interfacial dielectric 48 if not removed, an oxide (e.g., silicon oxide) formed by thermal or chemical oxidation of the fin 46, and/or an oxide (e.g., silicon oxide), nitride (e.g., silicon nitride), and/or another dielectric layer.

The gate dielectric layer 72 can be conformally deposited in the recesses where dummy gate stacks were removed (e.g., on top surfaces of the isolation regions 44, on the interfacial dielectric 70, and sidewalls of the gate spacers 54) and on the top surfaces of the first ILD 62, the CESL 60, and gate spacers 54. The gate dielectric layer 72 can be or include silicon oxide, silicon nitride, a high-k dielectric material (examples of which are provided above), multilayers thereof, or other dielectric material.

Then, the one or more optional conformal layers 74 can be conformally (and sequentially, if more than one) deposited on the gate dielectric layer 72. The one or more optional conformal layers 74 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

A layer for the gate conductive fill material 76 is formed over the one or more optional conformal layers 74 (e.g., over the one or more work-function tuning layers), if implemented, and/or the gate dielectric layer 72. The layer for the gate conductive fill material 76 can fill remaining recesses where the dummy gate stacks were removed. The layer for the gate conductive fill material 76 may be or comprise a metal-containing material such as tungsten, cobalt, aluminum, ruthenium, copper, multi-layers thereof, a combination thereof, or the like. Portions of the layer for the gate conductive fill material 76, one or more optional conformal layers 74, and gate dielectric layer 72 above the top surfaces of the first ILD 62, the CESL 60, and gate spacers 54 are removed, such as by a CMP. The replacement gate structures comprising the gate conductive fill material 76, one or more optional conformal layers 74, gate dielectric layer 72, and interfacial dielectric 70 may therefore be formed as illustrated in FIG. 4.

Figure 5:
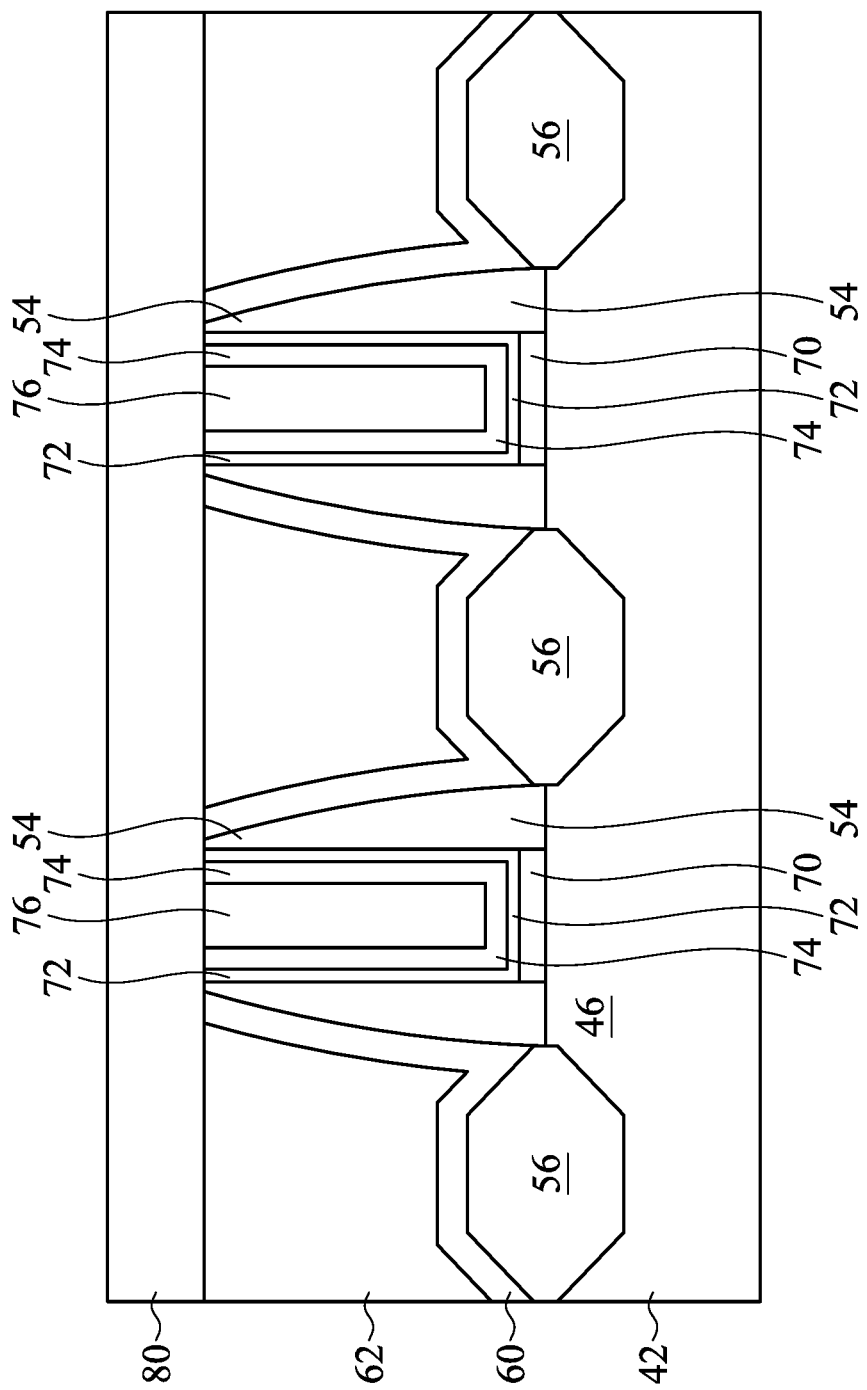

FIG. 5 illustrates the formation of a second ILD 80 over the first ILD 62, CESL 60, gate spacers 54, and replacement gate structures. Although not illustrated, in some embodiments, an ESL may be deposited over the first ILD 62, etc., and the second ILD 80 may be deposited over the ESL. If implemented, the ESL may comprise or be silicon nitride, silicon carbon nitride, silicon carbon oxide, carbon nitride, the like, or a combination thereof. The second ILD 80 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

Figure 6:
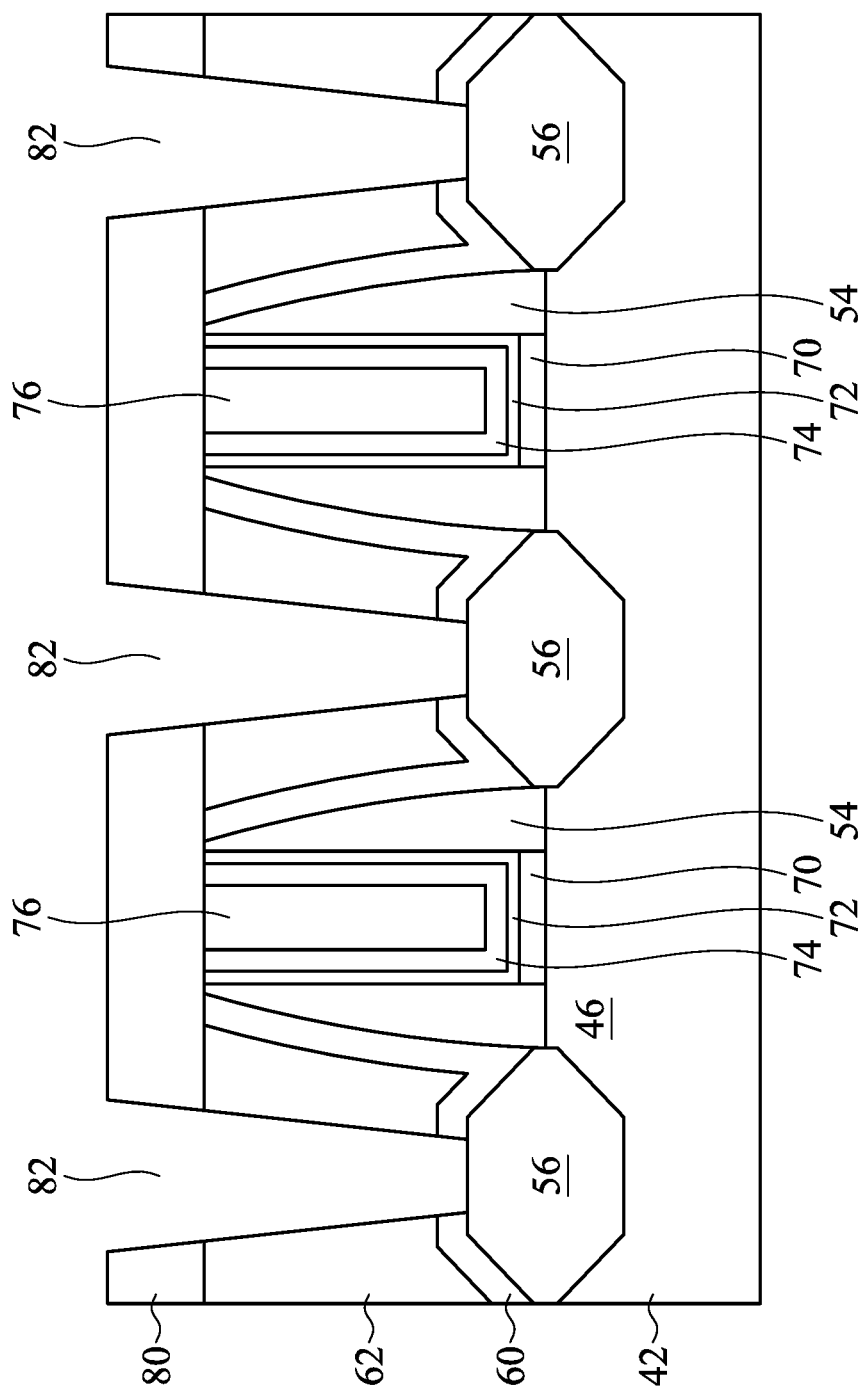

FIG. 6 illustrates the formation of openings 82 through the second ILD 80, the first ILD 62, and the CESL 60 to expose at least a portion of an epitaxy source/drain region 56. The second ILD 80, the first ILD 62, and the CESL 60 may be patterned with the openings 82, for example, using photolithography and one or more etch processes.

Figure 7:
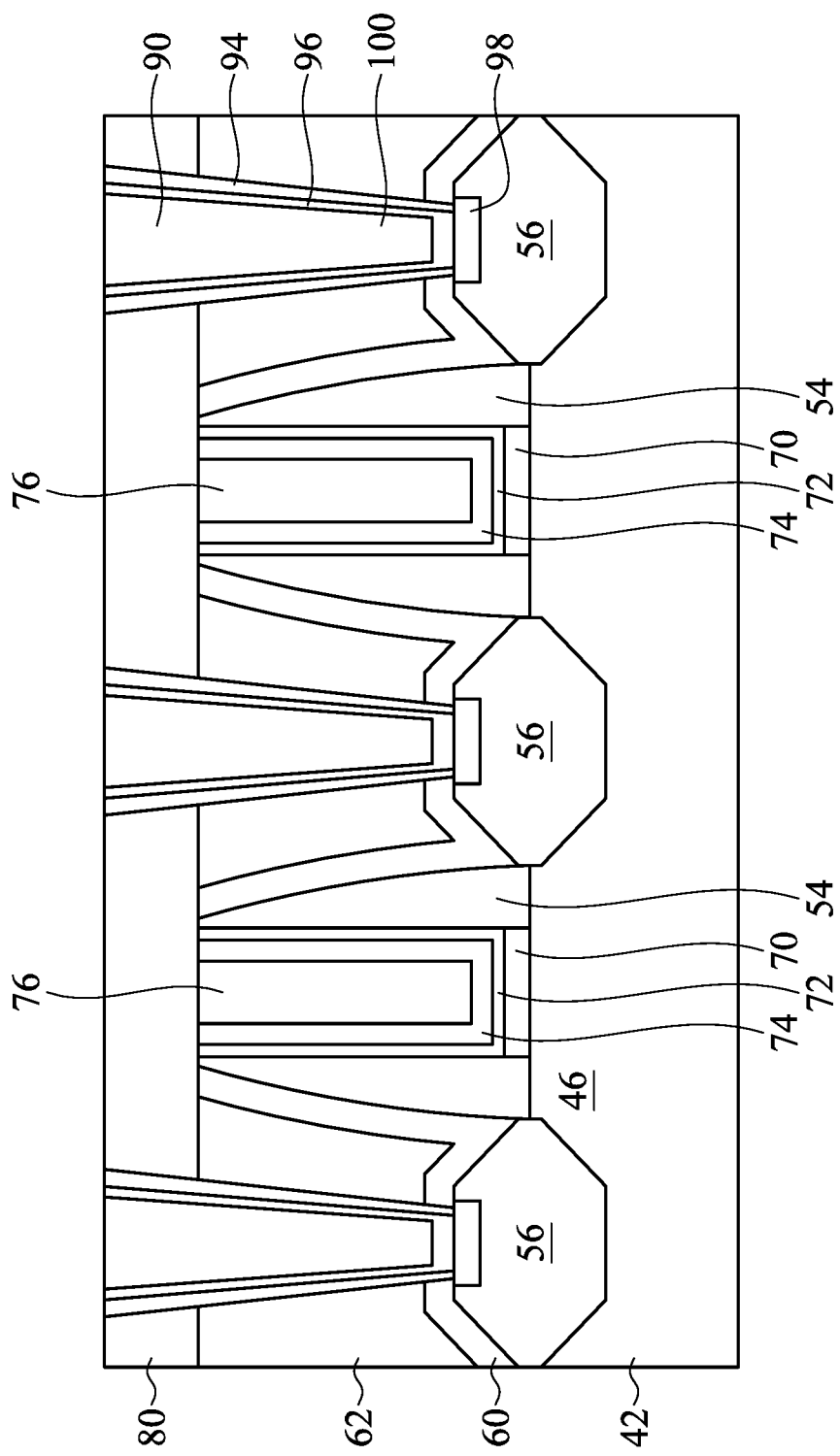

FIG. 7 illustrates the formation of first conductive features 90 in the openings 82 to the epitaxy source/drain region 56. The first conductive feature 90 includes, in the illustrated embodiment, an adhesion layer 94, a barrier layer 96 on the adhesion layer 94, a silicide region 98 on the epitaxy source/drain region 56, and a conductive fill material 100 on the barrier layer 96, for example.

The adhesion layer 94 can be conformally deposited in the openings 82 (e.g., on sidewalls of the openings 82, exposed surface of the epitaxy source/drain region 56, and exposed surface of the replacement gate structure) and over the second ILD 80. The adhesion layer 94 may be or comprise titanium, tantalum, the like, or a combination thereof, and may be deposited by atomic layer deposition (ALD), chemical vapor deposition (CVD), physical vapor deposition (PVD), or another deposition technique. The barrier layer 96 can be conformally deposited on the adhesion layer 94, such as in the openings 82 and over the second ILD 80. The barrier layer 96 may be or comprise titanium nitride, titanium oxide, tantalum nitride, tantalum oxide, the like, or a combination thereof, and may be deposited by ALD, CVD, or another deposition technique. In some embodiments, at least a portion of the adhesion layer 94 can be treated to form the barrier layer 96. For example, a nitridation process, such as including a nitrogen plasma process, can be performed on the adhesion layer 94 to convert at least the portion of the adhesion layer 94 into the barrier layer 96. In some embodiments, the adhesion layer 94 can be completely converted such that no adhesion layer 94 remains and the barrier layer 96 is an adhesion/barrier layer, while in other embodiments, a portion of the adhesion layer 94 remains unconverted such that the portion of the adhesion layer 94 remains with the barrier layer 96 on the adhesion layer 94.

Silicide region 98 may be formed on the epitaxy source/drain region 56 by reacting an upper portion of the epitaxy source/drain region 56 with the adhesion layer 94, and possibly, the barrier layer 96. An anneal can be performed to facilitate the reaction of the epitaxy source/drain region 56 with the adhesion layer 94 and/or barrier layer 96.

The conductive fill material 100 can be deposited on the barrier layer 96 and fill the openings 82. The conductive fill material 100 may be or comprise tungsten, copper, ruthenium, aluminum, cobalt, gold, silver, alloys thereof, the like, or a combination thereof, and may be deposited by CVD, ALD, PVD, or another deposition technique. After the conductive fill material 100 is deposited, excess conductive fill material 100, barrier layer 96, and adhesion layer 94 may be removed by using a planarization process, such as a CMP, for example. The planarization process may remove excess conductive fill material 100, barrier layer 96, and adhesion layer 94 from above a top surface of the second ILD 80. Hence, top surfaces of the first conductive features 90 and the second ILD 80 may be coplanar. The first conductive features 90 may be referred to as contacts, plugs, etc.

Figure 8:
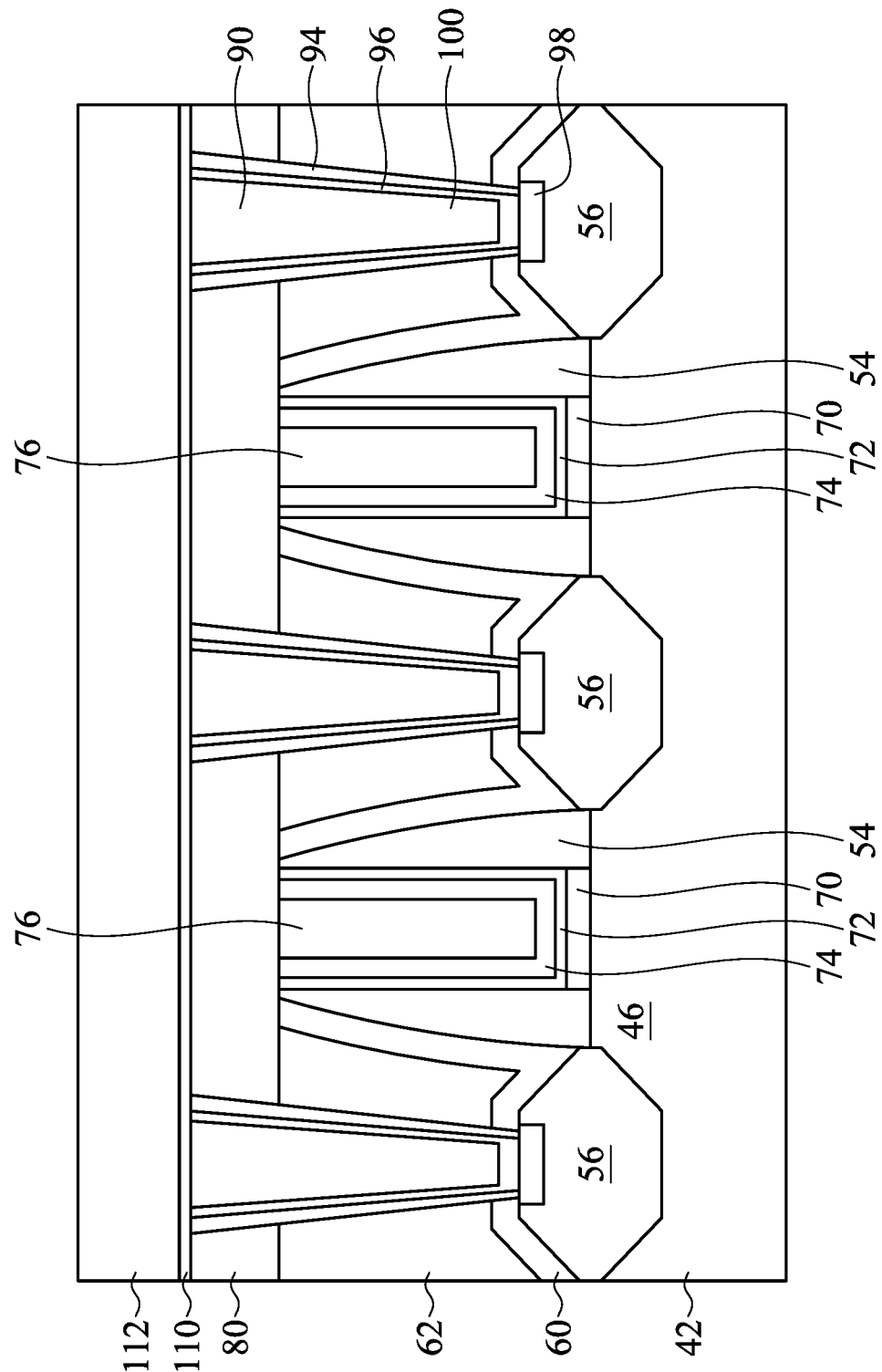

FIG. 8 illustrates the formation of a middle contact etch stop layer (MCESL) 110 and an intermetallization dielectric (IMD) 112 over the MCESL 110. The MCESL 110 is deposited on top surfaces of the second ILD 80 and conductive features 90. The MCESL 110 may comprise or be silicon nitride, silicon carbon nitride, silicon carbon oxide, carbon nitride, the like, or a combination thereof, and may be deposited by CVD, plasma enhanced CVD (PECVD), ALD, or another deposition technique. The IMD 112 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The IMD 112 may be deposited by spin-on, CVD, flowable CVD (FCVD), PECVD, PVD, or another deposition technique. A thickness of the MCESL 110 can be in a range from about 10 nm to about 500 nm, and a thickness of the IMD 112 can be in a range from about 50 nm to about 800 nm. A combined thickness of the IMD 112 and MCESL 110 can be in a range from about 100 nm to about 1000 nm.

Figure 9:
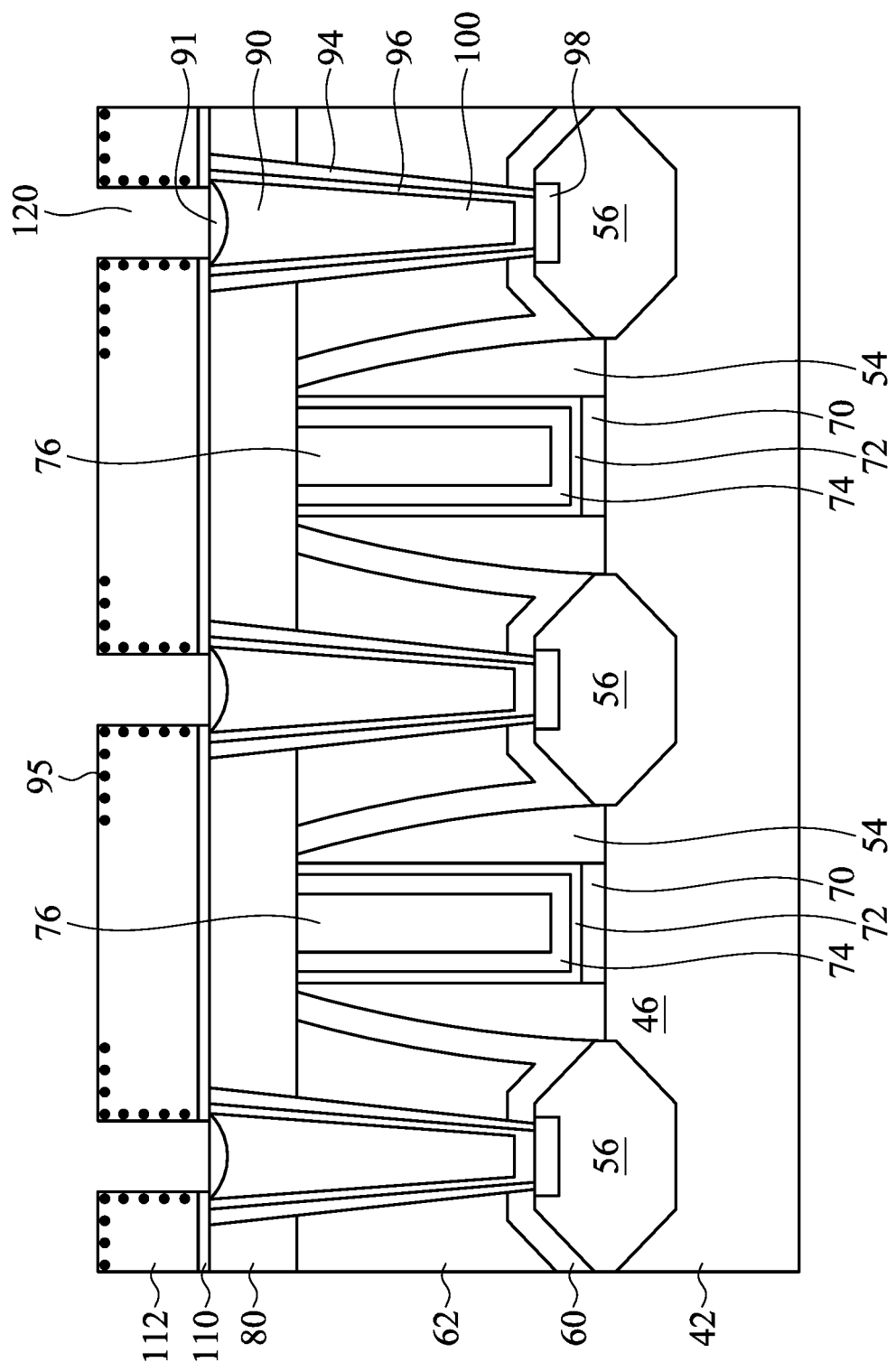

FIG. 9 illustrates the formation of vias 120 to the first conductive features 90, through the IMD 112 and MCESL 110. The IMD 112 and MCESL 110 may be patterned with the vias 120, for example, using photolithography and one or more etch processes. The etch process may include a reactive ion etch (RIE), neutral beam etch (NBE), inductively coupled plasma (ICP) etch, capacitively coupled plasma (CCP) etch, ion beam etch (IBE), the like, or a combination thereof. The etch process may be anisotropic. In some embodiments, the etching process can include a plasma using a first gas comprising carbon tetrafluoride ($CF_4$), methane ($CH_4$), hexafluoroethane ($C_2F_6$), octafluoropropane ($C_3F_8$), fluoroform ($CHF_3$), difluoromethane ($CH_2F_2$), fluoromethane ($CH_3F$), a carbon fluoride (e.g., $C_xF_y$, where x can be in a range from 1 to 5 and y can be in a range from 4 to 8), the like, or a combination thereof. The plasma can further use a second gas comprising nitrogen ($N_2$), hydrogen ($H_2$), oxygen ($O_2$), argon (Ar), xenon (Xe), helium (He), carbon monoxide (CO), carbon dioxide ($CO_2$), carbonyl sulfide (COS), the like, or a combination thereof. An inert gas may be optionally supplied during the etching process. In some embodiments, a ratio of the flow rate of the first gas to the flow rate of the second gas can be in a range from about 50 sccm to about 200 sccm. A pressure of the plasma etch can be in a range from about 15 mTorr to about 500 mTorr. A power of the plasma generator for the plasma etch can be in a range from about 50 W to about 1500 W. A frequency of the plasma generator for the plasma etch can be about 2 MHz, about 27 MHz, or from about 2 MHz to about 60 MHz. A substrate bias voltage of the plasma etch can be in a range from about −2.5 kV to about 2.5 kV and with a duty cycle in a range from about 30% to about 80%.

FIG. 9 further illustrates the formation of residual regions 91 on top surfaces of the first conductive features 90. The residual regions 91 are formed by the reaction of the top surfaces of the first conductive features 90 with etchants from the formation of vias 120. In some embodiments, the etchants may comprise fluorine and the material of the residual regions 91 may comprise a water-soluble metal fluoride such as, e.g. cobalt fluoride. The residual regions 91 may also comprise residuals coming from the environment when transferring the substrate 42 between different processing chambers while forming the IMD 112 and MCESL 110. The residual regions 91 may further comprise native oxides or carbon-rich polymers formed on the surfaces of the residual regions 91. Additional residual impurities 95 remaining from the etching, e.g. etch byproducts such as $CF_xH_y$, or carbon-rich polymers may be left on the sidewalls of vias 120 and on the top surface of IMD 112.

Figure 10A:
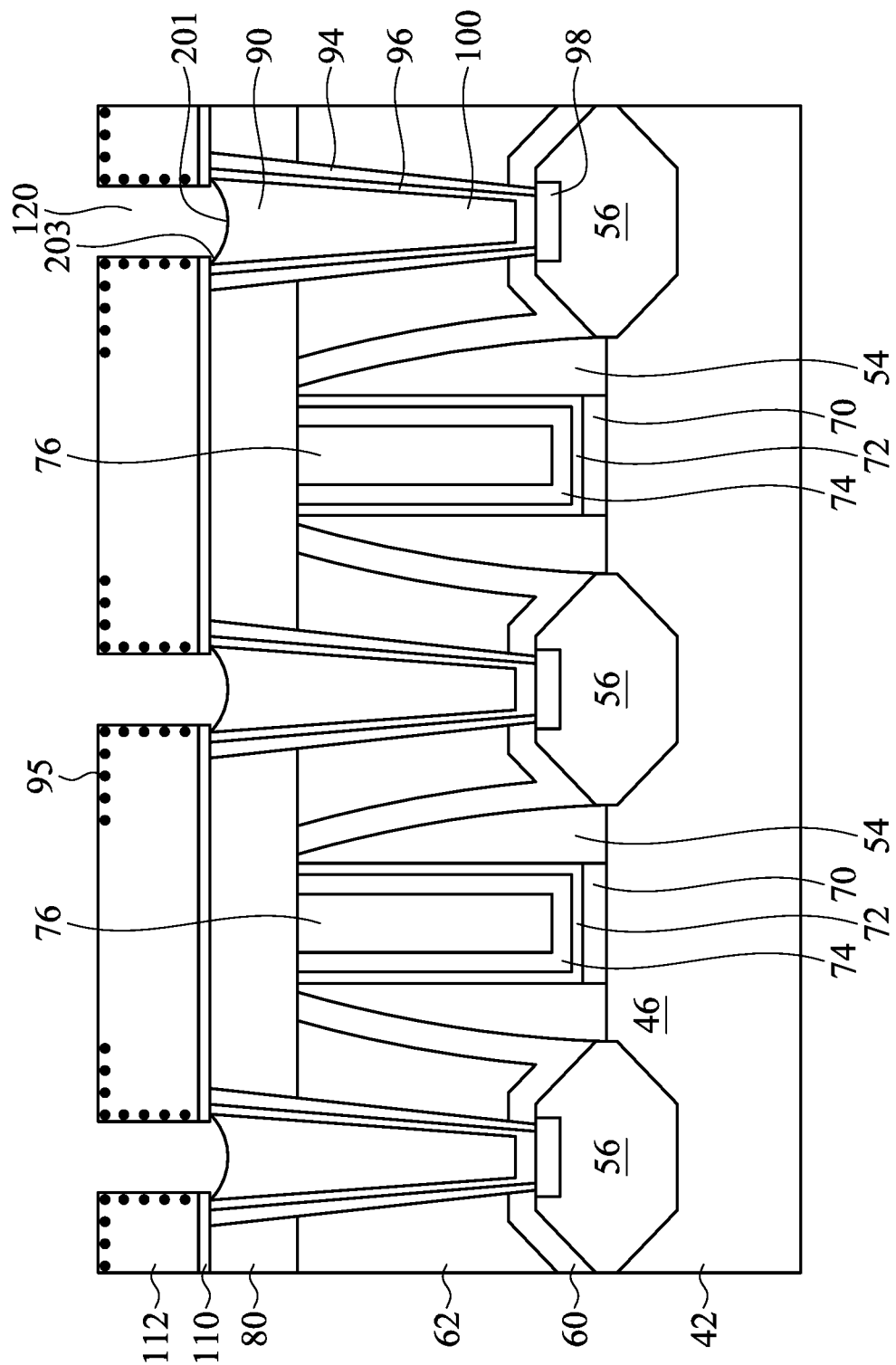

FIG. 10A illustrates the formation of recesses 201 in the first conductive features 90 and formed through the vias 120 to the first conductive features 90, respectively, through the IMD 112 and MCESL 110. After the vias 120 are formed, a wet cleaning process may be performed to remove the residual regions 91 from the first conductive features 90. The wet cleaning process is performed to efficiently remove the residual regions 91 from the surfaces of the first conductive features 90 and to remove etching byproducts on the sidewalls of the IMD 112. The wet cleaning process removes the surface of the first conductive features 90 to form the recesses 201 on the surface of the first conductive features 90 after the residual regions 91 are removed therefrom.

In an embodiment, the wet cleaning process can include immersing the semiconductor substrate 42 in deionized (DI) water or another suitable chemical (which may be diluted in DI water). In another embodiment, the wet cleaning process uses ammonium hydroxide. The DI water may remove the native oxide grown on the surface of the first conductive features 90. In an embodiment wherein the first conductive features 90 are fabricated from Co containing materials, DI water may efficiently dissolve the residual material which may be a water-soluble metal fluoride such as e.g. cobalt fluoride, thus removing the material of the residual regions 91 and forming the recesses 201 on the first conductive features 90. In other embodiments, a chemical etchant which reacts with the material of the first conductive features 90 may be utilized. The recesses 201 may be formed as a concave surface (e.g., an upper concave surface on the first conductive features 90) having tip ends 203 (as shown in the recess 201) formed under a bottom surface of the MCESL 110. As the wet cleaning process is an isotropic etching process, the chemical reaction between the solution and the first conductive features 90 isotropically and continuously occurs when the solution contacts the first conductive features 90 until a predetermined process time period of 170 seconds is reached. The tip ends 203 of the recesses 201 extend laterally from the first conductive features 90 and further extend underneath the bottom surface of the MCESL 110. The tip ends 203 may assist the materials subsequently formed therein to anchor and engage in the vias 120 with better adhesion and clinch.

The recesses 201 may be formed to a depth of between about 5 nm to about 10 nm. The ratio of the depth of the recesses 201 to the ratio of the depth of the vias 120 may be in a range between about 5:17 to about 10:15. The ratio of the depth of the recesses 201 to the ratio of the depth of the opening 82 may be in a range between about 5:60 to about 10:55. The ratio of the depth of the recess 201 to the ratio of the depth of the conductive fill material 100 may be in a range between about 5:59 to about 10:54. The width of tip end 203 may be in a range between about 3 nm to about 7 nm. A width of the tip end 203 of less than about 3 nm may result in the first conductive features 90 being damaged by slurry produced after a CMP applied to the subsequently formed second conductive features 206, because the second conductive features 206 may be formed by tungsten deposition without a TiN barrier and the second conductive features 206 may have reduced adhesion with the IMD 112. A width of the tip end 203 of more than about 10 nm may contact the barrier layer 96, leading to higher via resistance. The ratio of the width of tip end 203 to the width of via 120 may be in a range between about 3:15 to about 7:17. The ratio of the width of tip end 203 to the depth of the conductive fill material 100 may be in a range between about 3:54 to about 7:59. By forming the recesses 201 within the ratios as described, the subsequently formed second conductive features 206 (not illustrated in FIG. 10A but illustrated and described below with respect to FIG. 12A) can still be reduced in size while still making good connections to the underlying first conductive features 90.

Figure 10B:
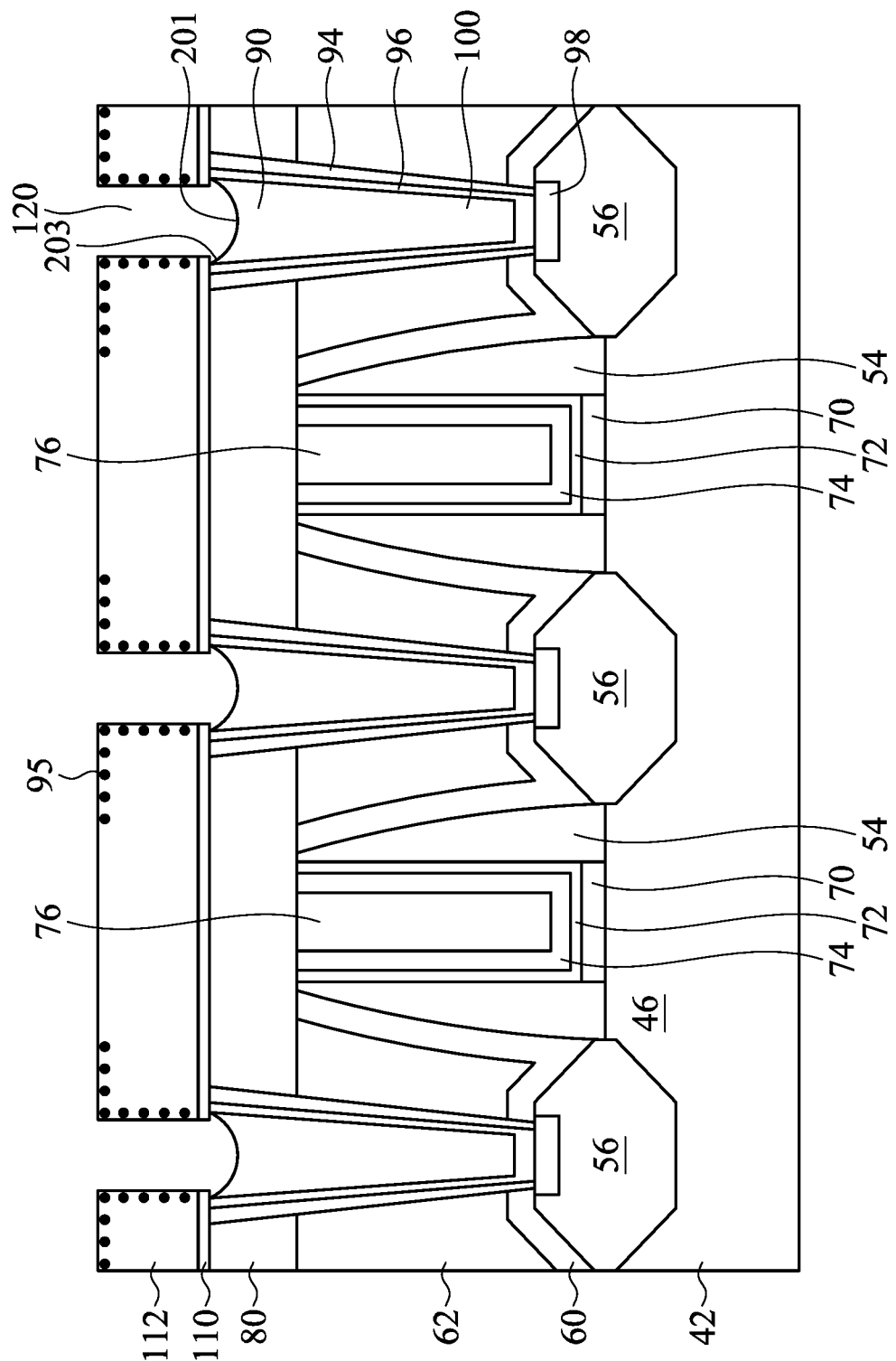

FIG. 10B illustrates a further optional cleaning of the semiconductor substrate 42 after the DI water cleaning in a solution including other chemicals in DI water. Suitable examples of the chemicals include acid chemicals, such as citric acid, or a mixture of acid chemicals. The chemicals in the DI water may have a concentration from about 5% to about 20% by volume. The solution, during the immersion, may be at a temperature in a range from about 30° C. to about 100° C. The semiconductor substrate 42 may be immersed in the solution for a duration in a range from about [50] seconds to about 200 seconds to form the recesses 201. After the cleaning, as illustrated in FIG. 10B, the recesses 201 may have a depth from the top (e.g., horizontal) surface of the second ILD 80 in a range greater than 5 Å, such as from about 5 Å to about 20 Å, and more particularly, such as from about 10 Å to about 15 Å, although other depths may be achieved. The semiconductor substrate 42 may optionally be rinsed in isopropyl alcohol (IPA) following the immersion in the solution to dry the semiconductor substrate 42.

Figure 11:
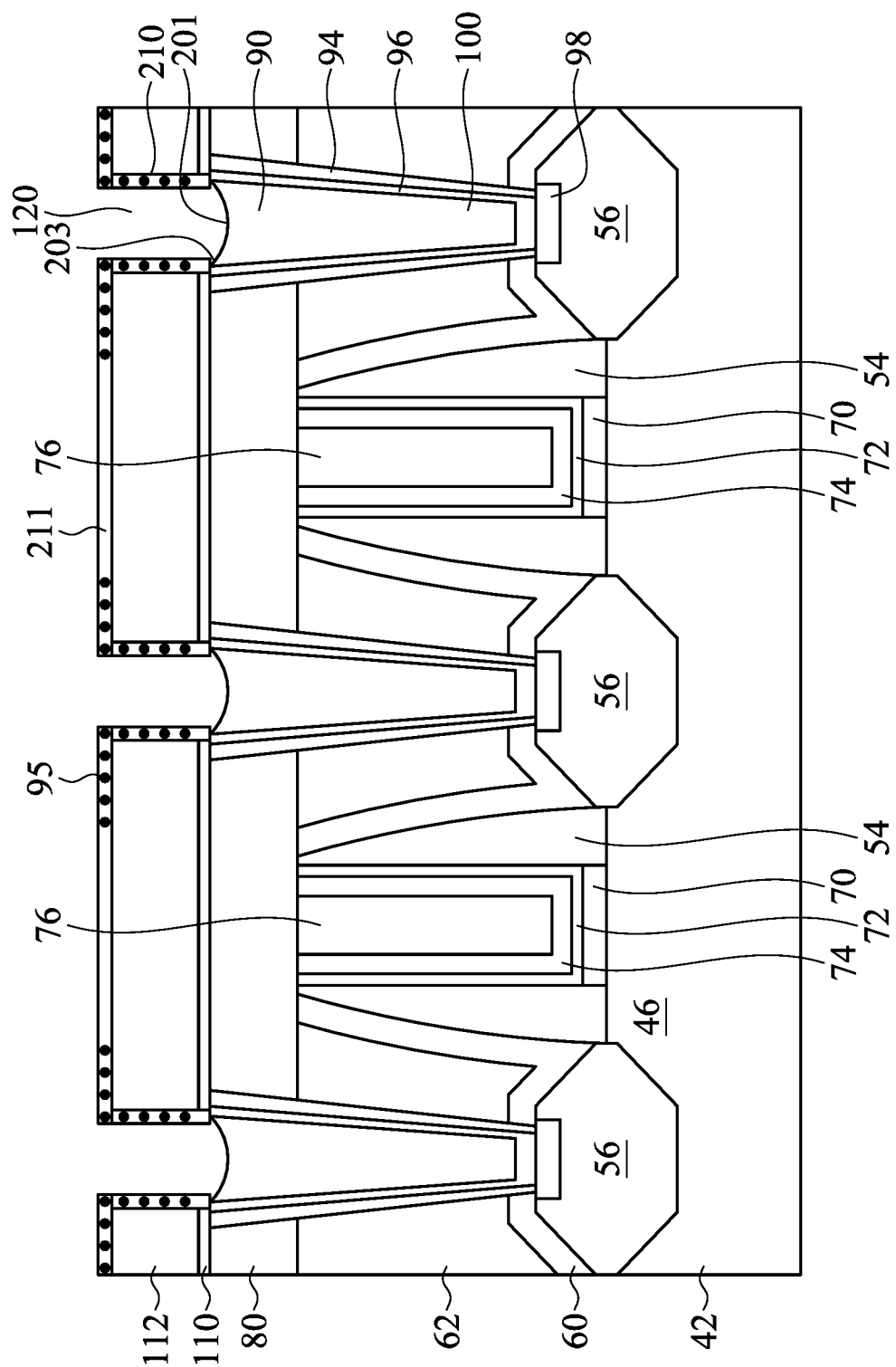

FIG. 11 illustrates the formation of oxide passivation layers 210 on the sidewalls of the vias 120, respectively, in accordance with the embodiment illustrated in FIG. 10A. In other embodiments, the oxide passivation layers 210 may be formed in accordance with the embodiment illustrated in FIG. 10B. An oxide passivation layer 211 may also be formed on the top surface of the IMD 112. The surface of the IMD 112 may be damaged by the etching of the vias 120, leaving dangling silicon bonds. Tungsten formed on a surface with dangling bonds may be susceptible to defect formation. The formation of the oxide passivation layers 210 and 211 may repair the surface of the IMD 112 to reduce dangling bonds and also have additional beneficial effects such as, e.g. removing carbon-like byproducts of the etching of the vias 120. In some embodiments, the oxide passivation layers 210 and 211 are formed in a remote plasma etcher using an $O_2$ treatment performed at a power of about 500 to 2500 W, at a pressure of about 0.5 to 5 torr, at a flow rate of about 2000 to 18000 sccm of $O_2$, at a temperature of about 50° C. to 250° C., and for a duration of about 30 to 180 seconds. In an embodiment, the $O_2$ treatment is performed at a power of about 1000 W, at a pressure of about 1 torr, at a flow rate of about 8000 sccm of $O_2$, and at a temperature of about 160° C. By performing the $O_2$ plasma treatment within the process conditions as described, the number of dangling silicon bonds can be reduced while carbon-like byproducts can simultaneously be removed during the etching of the vias 120, whereas process conditions outside of the range may not meet each of the desired results as fully as desired. Additionally, in some embodiments, an oxide, such as e.g. cobalt oxide (not shown in FIG. 11), may also be formed on top surfaces of the first conductive features 90 during the $O_2$ treatment.

In other embodiments, the oxide passivation layers 210 and 211 are formed by an $O_2$ thermal process at a pressure of about 0.5 to 2 torr, at a flow rate of about 3000 to 8000 sccm of $O_2$, at a temperature of about 275° C. to 350° C., and for a duration of about 180 to 360 seconds. In an embodiment, the thermal process is performed at a temperature of about 300° C. By performing the $O_2$ thermal process within the process conditions as described, the number of dangling silicon bonds can be reduced while carbon-like byproducts can simultaneously be removed during the etching of the vias 120, whereas process conditions outside of the range may not meet each of the desired results as fully as desired.

In yet another embodiment, $H_2$ and $N_2$ may be used in place of $O_2$ in a ratio of $N_2:H_2$ of about 4% to 100% to form the passivation layers 210 and 211. In such an embodiment, the parameters of the passivation layers 210 and 211 may be the same as the parameters of the oxide passivation layers 210 and 211 as described below.

The oxide passivation layers 210 and 211 may have a thickness of 3-10 monolayers, for a total thickness of about less than 5 monolayers. In some embodiments, a thickness of oxide passivation layer 210 on sidewalls of the via 120 may be different from a thickness of oxide passivation layer 211 on the top surface of IMD 112, and in such an embodiment, the ratio of the thickness of oxide passivation layer 210 on sidewalls of the via 120 to the thickness of oxide passivation layer 211 on the top surface of IMD 112 may be between about 2:40 to about 3:30. By forming the oxide passivation layers 210 and 211 to these thicknesses, the number of dangling silicon bonds can be reduced while carbon-like byproducts can be removed. The thickness of oxide passivation layer 210 at tip end 203 falls in a range between about 2 to about 3 monolayers.

Different etchants that may be used in the etching process shown in FIG. 9 such as $CF_4/COS/CHF_3$ may affect the thickness of 210/211 by about 5 nm. Different reactants used in the wet clean process shown in FIGS. 10A and 10B such as deionized water may affect the thickness of 210/211 by less than 1 nm. Additional chemicals used in the further optional cleaning described with respect to FIG. 10B such as DTPA (chelator), butoxyethanol (solvent), hydroxylamine (pH buffer), tolyltriazole (inhibitor), or diethylenetriaminepentaacetic acid may affect the thickness of 210/211 by less than 1 nm and may avoid loss of material from the first conductive features 90, such as e.g. cobalt. Different materials used for forming MCESL 110 may affect the thickness of 210/211 by less than 1 nm. The ratio of the thickness of oxide passivation layer 210 at tip end 203 to the width of the through via 120 may fall in a range between about 3:18 to about 7:15. By keeping the ratio of thicknesses to be within these ranges, corrosion caused by penetration of the CMP slurry can be reduced or eliminated, whereas ratios outside of these ranges may not reduce or eliminate the penetration as fully as desired.

The $O_2$ treatment used to form oxide passivation layers 210 and 211 acts to clean and trap impurities left behind by the etching of vias 120 and by the wet cleaning process used to form recesses 201. These deliberately created oxide passivation layers 210 and 211 are much more efficient at cleaning and trapping impurities than any native oxides present after the etching process. $C_xF_yH_z$ impurities from the etching of vias 120 may be present on the top surface of IMD 112 and on the sidewalls of IMD 112 and MCESL 110, shown as residual impurities 95 in FIGS. 9, 10A, and 10B. Further impurities may remain on the bottom surfaces of recesses 201. Fluorine from the etching is oxidized by the $O_2$ treatment and encapsulated by the oxide passivation layers 210 and 211, as illustrated in Figure ii by the residual impurities 95 being encapsulated by the oxide passivation layers 210 and 211. The $O_2$ treatment also reduces outgassing from the MCESL 110. SiN from the MCESL 110 may react with moisture during the etching of openings 120 to release $NH_2$, which may subsequently react to form $NH_4$. The formation of oxide passivation layers 210 and 211 may also prevent $NH_4$ outgassing and reduce impurities.

Figure 12A:
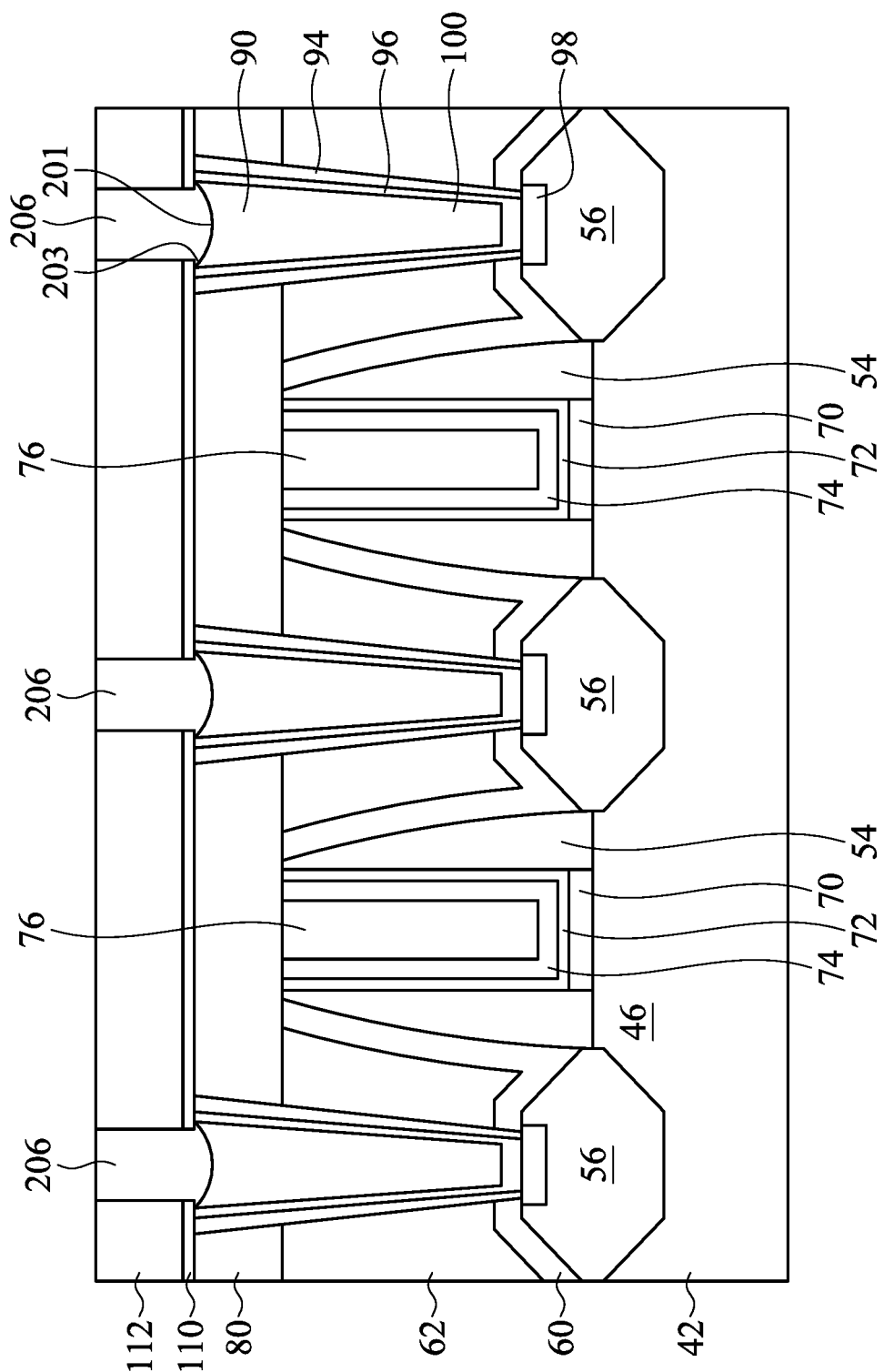

FIG. 12A illustrates the removal of the oxide passivation layers 210 and 211 along with any oxides formed on the first conductive features 90 and the formation of second conductive features 206 in the openings 120, in connection with the first conductive features 90. The second conductive features 206 are formed in the recesses 201 on the surface of the first conductive features 90. In an embodiment, the removal of the oxide passivation layers 210 and 211 and the formation of second conductive features 206 is performed in situ in a metal deposition tool. The oxide passivation layers 210 and 211 are removed in a pre-clean step with an $H_2$ plasma at 400 W, at a pressure of 5 torr, and at a temperature of 190° C. The removal of the oxide passivation layers 210 and 211 in the pre-clean step also removes impurities, such as $C_xF_yH_z$ impurities from the etching of vias 120, that have been trapped and encapsulated by the oxide passivation layers 210 and 211.

FIG. 12A also illustrates the formation of second conductive features 206 in the openings 120 in connection with the first conductive features 90. The second conductive features 206 are formed in the recesses 201 on the surface of the first conductive features 90, filling the recesses 201. The second conductive features 206 are formed in situ in the metal deposition tool. The second conductive features 206 can be deposited in the openings 120 by CVD, ALD, electroless deposition (ELD), PVD, electroplating, or another deposition technique. The second conductive features 206 may be or comprise tungsten, cobalt, copper, ruthenium, aluminum, gold, silver, alloys thereof, the like, or a combination thereof.

Figure 12B:
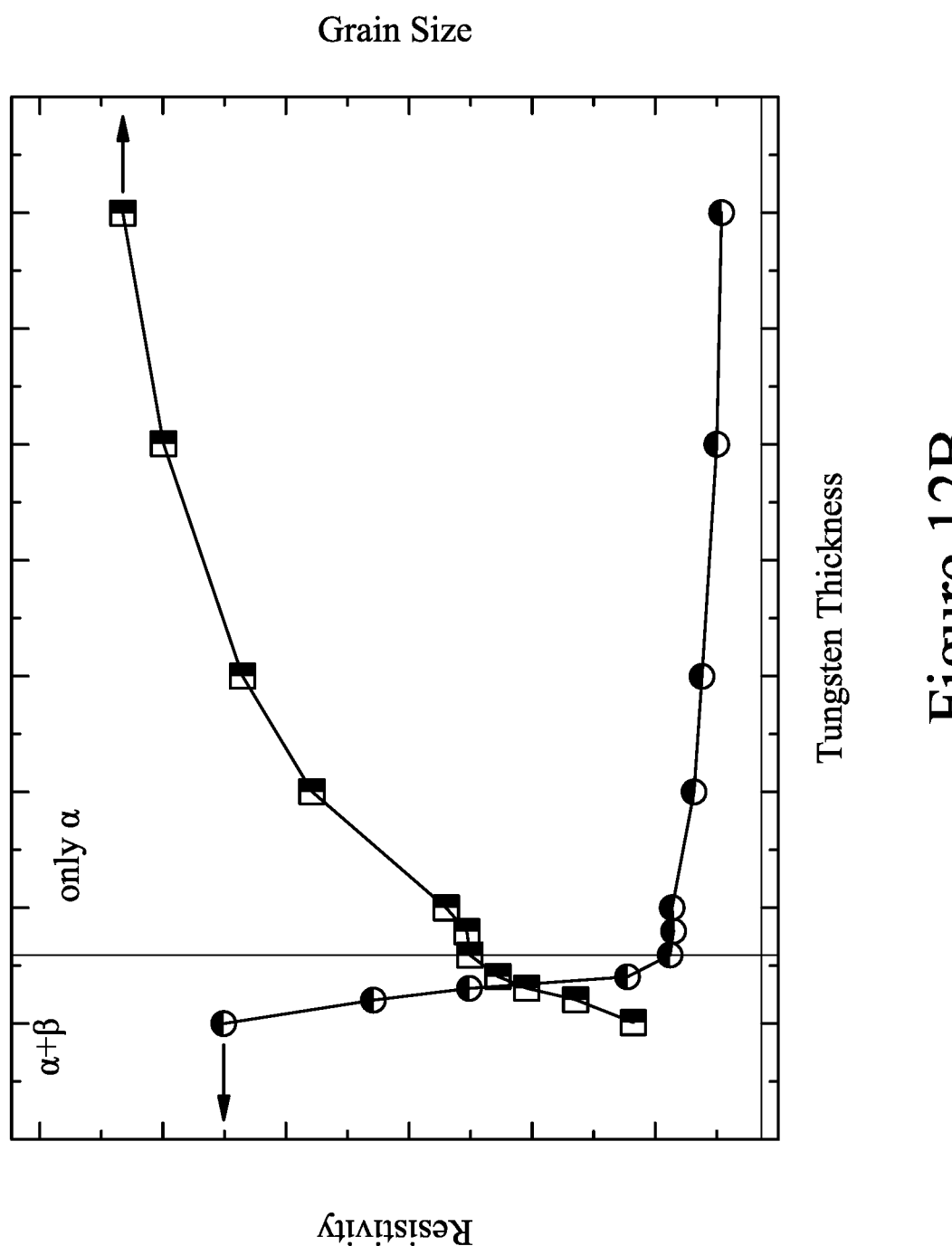
FIGS. 12B and 12C illustrate properties of $\alpha$ and $\beta$ phases of tungsten, in accordance with some embodiments.

FIG. 12B illustrates the resistivity of the α and β phases of tungsten and the grain sizes of tungsten versus the thickness of a tungsten film. As shown, the resistivity of α phase tungsten is considerably less than the resistivity of a combination of α phase and β tungsten. In an embodiment, the second conductive features 206 comprise tungsten and the reduction of impurities by the formation and removal of oxide passivation layers 210 and 211 will induce a greater amount of the tungsten to transition from the metastable β phase to the α phase with lower resistance, reducing the resistance of the second conductive features 206.

Figure 12C:
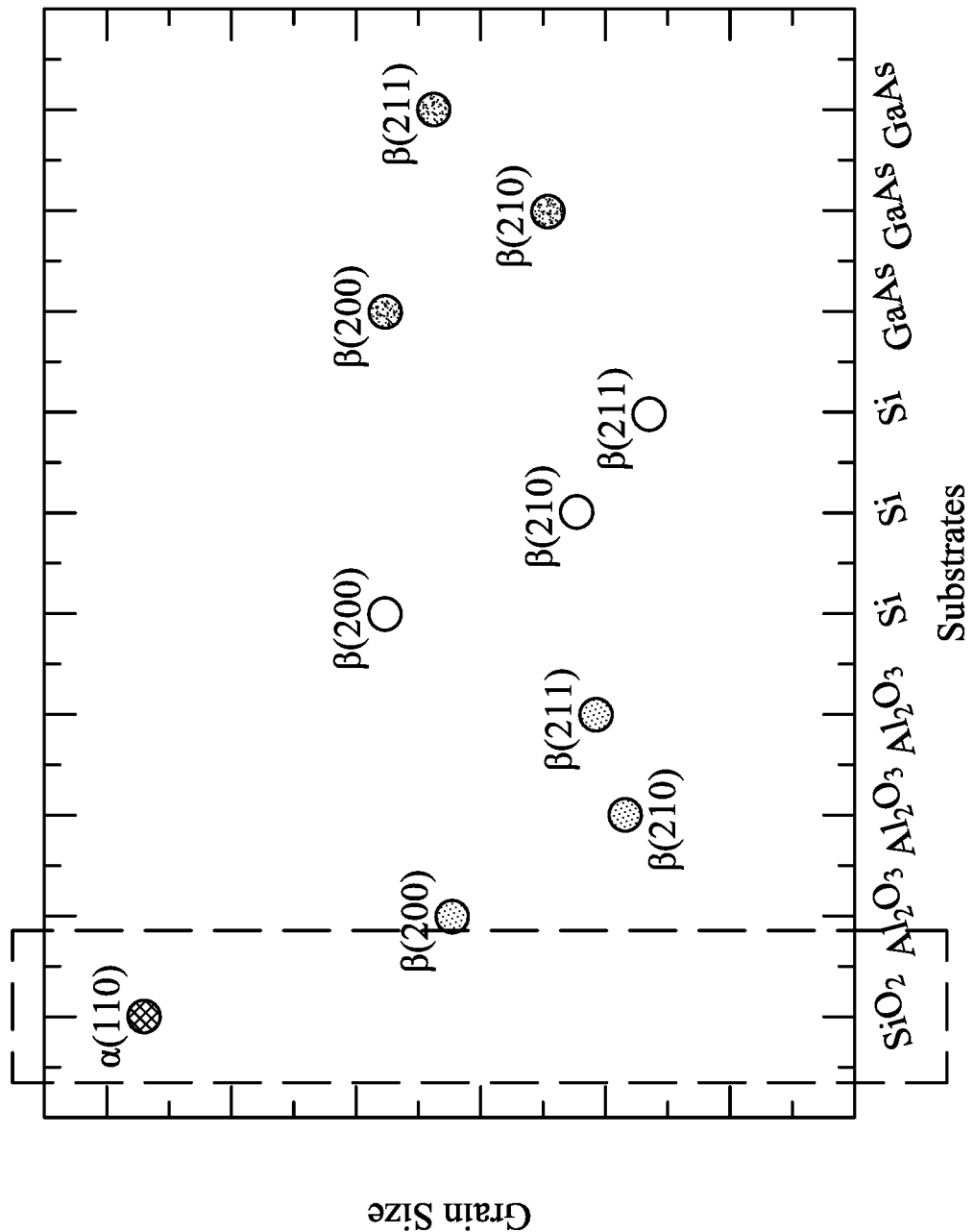

FIG. 12C illustrates the grain size of tungsten versus the composition of substrates that tungsten films may be disposed upon. As shown, tungsten (W) disposed upon $SiO_2$ has a strong preference for α phase W. Therefore a ratio of the amount of α phase W to β phase W in the second conductive features 206 may be about 100%, because stable α phase W is preferred on $SiO_2$, and a reduction in impurities by the formation and removal of oxide passivation layers 210 and 211 may leave a more pure $SiO_2$ surface on the sidewalls of the IMD 120.

When the second conductive features 206 substantially fill the openings 120, the deposition process is then terminated, as shown in FIG. 12A. As the second conductive features 206 grow on the first conductive features 90 and fill the recesses 201, the resultant second conductive features 206 may have a bottom portion having a substantially rounded and/or convex structure (filling the concave surface from the recesses 201) that contacts a curved top surface of the conductive fill material 100. The excess of second conductive feature 206 outgrown from the openings 120 may be removed by using a planarization process, such as a CMP, for example. The planarization process may remove excess second conductive feature 206 from above a top surface of the IMD 112. Hence, top surfaces of the second conductive features 206 and the IMD 112 may be coplanar. The second conductive features 206 may be referred to as contacts, plugs, conductive lines, conductive pads, vias, via-to-interconnect layers (V0s), etc.

The second conductive feature 206 may be formed with a width of between about 15 nm to about 19 nm and a depth of between about 30 nm to about 50 nm. By keeping the respective widths and depths to the ranges described and also utilizing the processes described herein, the side-effect of such small dimensions (e.g., working to prevent tungsten from transitioning from the β phase to the α phase) can be overcome, whereas with larger dimensions the processes, while still useful, may not be as beneficial. The tip portions of the second conductive features 206 may underhang MCESL 110 and IMD 112 by a width of between about 20 nm to about 26 nm. Top surfaces of the tip portions of the second conductive features 206 may be in direct contact with the bottom surfaces of MCESL 110.

Figure 13:
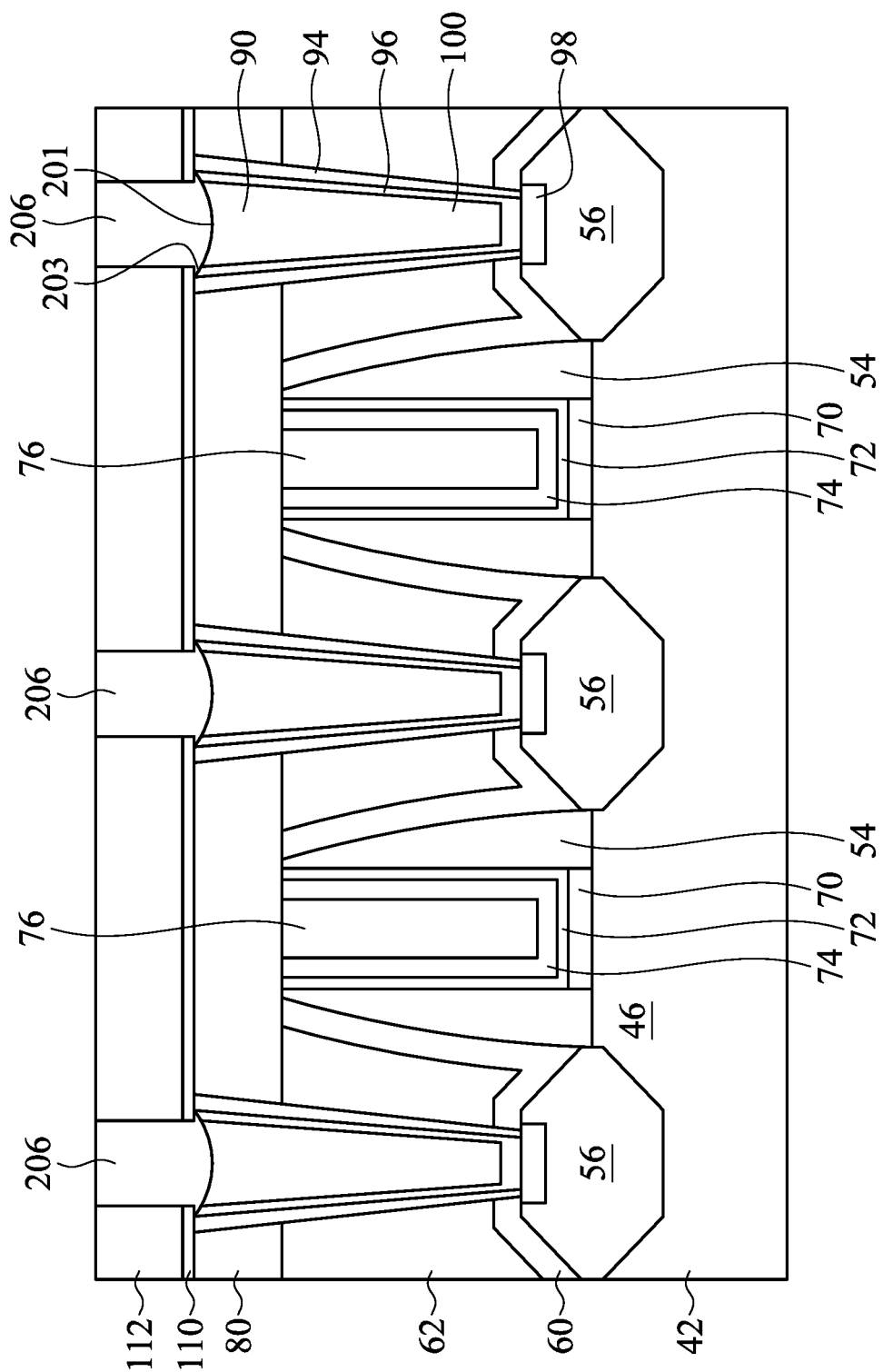

FIG. 13 illustrates an embodiment in which tip portions of second conductive features 206 are directly adjacent to the adhesion layer 94, so that the widest parts of second conductive features 206 are larger than the widest part of the conductive fill material 100. In such an embodiment, the etching of vias 120 is timed such that the adhesion layer 94 is exposed. In this embodiment, the second conductive feature 206 may be formed with a width of between about 20 nm to about 26 nm measured between the tip portions of 206. This is advantageous because in some embodiments in which the first conductive features 90 comprise cobalt, the cobalt may benefit from protection by being completely covered by the tip portions of the second conductive features 206. In embodiments in which the second conductive features 206 comprise tungsten, it is advantageous for the second conductive features 206 to avoid direct contact with the adhesion layer 94. This is because the adhesion layer 94 may comprise TiN which may work to prevent tungsten from transitioning from the β phase to the α phase.

As discussed above, the formation and removal of an oxide passivation layer prior to the formation of via-to-interconnect (V0) layers can reduce contact resistance in the V0s. This is achieved by reducing impurities from the prior etching of the via openings and reducing $NH_4$ outgassing from the adjacent MCESL sidewalls by the oxide passivation layer covering the sidewalls of the vias and the adjacent MCESL sidewalls and encapsulating the impurities remaining from the prior etching. Reduction of impurities can induce tungsten in the V0 to transition from the metastable β phase to the α phase with lower resistance, resulting in lower contact resistance in the formed V0 layers.

In accordance with an embodiment, a method of manufacturing a device includes forming a via through a dielectric layer over a source/drain contact, forming a recess through the via to form a curved top surface of the source/drain contact, forming an oxide liner on a sidewall of the via, and removing the oxide liner. In an embodiment, the oxide liner is formed with an $O_2$ treatment. In an embodiment, the $O_2$ treatment is a plasma treatment or a thermal process that takes place at a temperature between about 50° C. to 250° C. In an embodiment, the plasma treatment takes place at a pressure of between about 0.5 torr to about 5 torr, and at a flow rate of about 2,000 sccm to about 18,000 sccm of $O_2$. In an embodiment, the plasma treatment takes place at a process power of about 500 W to about 25000 W and at a temperature of about 50° C. to about 250° C. In an embodiment, the oxide liner is formed to have a thickness of between about 3 monolayers and about 10 monolayers. In an embodiment, the oxide liner is formed to overhang a portion of the source/drain contact. In an embodiment, wherein the recess is formed by a wet clean to include a semicircular shape.

In accordance with another embodiment, a method of manufacturing a device includes etching a via through a dielectric layer and an etch stop layer (ESL) to a source/drain contact, forming a recess in a top surface of the source/drain contact such that the top surface of the source/drain contact is concave, forming an oxide liner on the sidewalls of the via such that the oxide liner traps impurities left behind by the etching of the via through the dielectric layer and the ESL and such that the etching, the forming the recess, and the forming the oxide liner are performed in a first chamber, performing a pre-cleaning such that the pre-cleaning includes removing the oxide liner, and depositing a metal in the via, wherein the performing the pre-cleaning and the depositing the metal are performed in situ in a second chamber different from the first chamber. In an embodiment, the pre-cleaning is performed at about 150° C. to 200° C. with bias power for plasma treatment between about 500 W to about 25000 W. In an embodiment, the top surface of the source/drain contact reacts with the etch to form a water-soluble metal fluoride. In an embodiment, the wet clean includes deionized water or ammonium hydroxide washing away the water-soluble metal fluoride. In an embodiment, the oxide liner is also formed on a top surface of the dielectric layer. In an embodiment, the metal includes tungsten and the performing the pre-cleaning removes impurities. In an embodiment, the removal of the impurities causes the tungsten to have a ratio of the amount of α phase tungsten to β phase tungsten of about 100%. In an embodiment, the oxide liner is formed to have a thickness of about 3 monolayers to about 10 monolayers. In an embodiment, the recess is formed to a depth between about 7 nm to about 11 nm.

In accordance with yet another embodiment, a semiconductor device includes a source/drain region, an etch stop layer (ESL) disposed above the source/drain region, a metal contact disposed above the source/drain region and below the ESL, and a via-to-interconnect layer disposed on the metal contact, such that the interface of the via-to-interconnect layer with the metal contact includes a semicircular shape, such that the ESL overhangs a portion of the via-to-interconnect layer, such that the via-to-interconnect layer includes tungsten (W), and such that a ratio of the amount of α phase W to β phase W in the via-to-interconnect layer is about 100%. In an embodiment, the metal contact includes cobalt. In an embodiment, the ESL overhangs a portion of the via-to-interconnect layer by between about 7 nm to about 11 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, comprising:
   forming a via through a dielectric layer over a source/drain contact;
   forming a recess through the via to form a curved top surface of the source/drain contact;
   forming an oxide liner on a sidewall of the via; and
   removing the oxide liner, wherein the removing the oxide liner exposes at least a portion of the sidewall of the via.

2. The method of claim 1, wherein the oxide liner is formed with an $O_2$ treatment.

3. The method of claim 2, wherein the O$_2$ treatment is a plasma treatment or a thermal process that takes place at a temperature between about 50° C. to 250° C.

4. The method of claim 3, wherein the plasma treatment takes place at a pressure of between about 0.5 torr to about 5 torr, and at a flow rate of about 2,000 sccm to about 18,000 sccm of O$_2$.

5. The method of claim 3, wherein the plasma treatment takes place at a process power of about 500 W to about 25000 W and at a temperature of about 50° C. to about 250° C.

6. The method of claim 1, wherein the oxide liner is formed to have a thickness of between about 3 monolayers and about 10 monolayers.

7. The method of claim 1, wherein the oxide liner is formed to overhang a portion of the source/drain contact.

8. The method of claim 1, wherein the recess is formed by a wet clean to comprise a semicircular shape.

9. A method of manufacturing a device, comprising:
etching a via through a dielectric layer and an etch stop layer (ESL) to a source/drain contact;
forming a recess in a top surface of the source/drain contact with a wet clean such that the top surface of the source/drain contact is concave;
forming an oxide liner on sidewalls of the via, wherein the oxide liner traps impurities left behind by the etching of the via through the dielectric layer and the ESL, wherein the etching, the forming the recess, and the forming the oxide liner are performed in a first chamber;
performing a pre-cleaning, wherein the pre-cleaning comprises removing the oxide liner; and
depositing a metal in the via, wherein the metal physically contacts a sidewall of the dielectric layer, wherein the performing the pre-cleaning and the depositing the metal are performed in situ in a second chamber different from the first chamber.

10. The method of claim 9, wherein the pre-cleaning is performed at about 150° C. to 200° C. with bias power for plasma treatment between about 500 W to about 25000 W.

11. The method of claim 9, wherein the top surface of the source/drain contact reacts with etchants used during the etching of the via to form a water-soluble metal fluoride.

12. The method of claim 11, wherein the wet clean comprises deionized water or ammonium hydroxide washing away the water-soluble metal fluoride.

13. The method of claim 9, wherein the oxide liner is also formed on a top surface of the dielectric layer.

14. The method of claim 9, wherein the metal comprises tungsten and wherein the performing the pre-cleaning removes impurities.

15. The method of claim 14, wherein performing the pre-cleaning causes the tungsten to have a ratio of an amount of a phase tungsten to an amount of 13 phase tungsten of about 100%.

16. The method of claim 9, wherein the oxide liner is formed to have a thickness of about 3 monolayers to about 10 monolayers.

17. The method of claim 9, wherein the recess is formed to a depth between about 7 nm to about 11 nm.

18. A method of manufacturing a device, comprising:
forming a conductive feature through a first dielectric layer;
depositing a contact etch stop layer (CESL) over the first dielectric layer and the conductive feature;
forming a second dielectric layer on the CESL;
etching an opening through the second dielectric layer and through the CESL to a top surface of the conductive feature, the etching the opening forming a residual region on the top surface of the conductive feature;
performing a cleaning process to remove the residual region, the cleaning process forming a recess in the conductive feature;
forming an oxide layer on exposed surfaces of the second dielectric layer and the CESL, the oxide layer extending to a top vertex of the recess;
removing the entirety of the oxide layer from sidewalls of the opening; and
filling the recess and the opening with a conductive material.

19. The method of claim 18, wherein the conductive material comprises tungsten.

20. The method of claim 18, wherein the conductive material extends under the CESL.

* * * * *